US007008842B2

(12) United States Patent
Mazoyer et al.

(10) Patent No.: US 7,008,842 B2
(45) Date of Patent: Mar. 7, 2006

(54) PROCESS FOR FABRICATING A COMPONENT, SUCH AS A CAPACITOR IN AN INTEGRATED CIRCUIT, AND INTEGRATED-CIRCUIT COMPONENT

(75) Inventors: Pascale Mazoyer, Grenoble (FR); Christian Caillat, Grenoble (FR)

(73) Assignee: STMicroelectronics, S.A., Montrouge (FR)

( * ) Notice: Subject to any disclaimer, the term of this patent is extended or adjusted under 35 U.S.C. 154(b) by 0 days.

(21) Appl. No.: 10/136,682

(22) Filed: May 1, 2002

(65) Prior Publication Data

US 2002/0162677 A1 Nov. 7, 2002

(30) Foreign Application Priority Data

May 2, 2001 (FR) .................................. 01 05881

(51) Int. Cl.
*H01L 21/8242* (2006.01)

(52) U.S. Cl. ....................................... 438/253; 438/396

(58) Field of Classification Search ........ 438/253–256, 438/396–399; 257/303
See application file for complete search history.

(56) References Cited

U.S. PATENT DOCUMENTS 6,057,571 A 5/2000 Miller et al.
6,215,646 B1 4/2001 Ochiai et al.
6,251,726 B1 * 6/2001 Huang ........................ 438/253

FOREIGN PATENT DOCUMENTS

| | | |
|---|---|---|
| EP | 0997933 A1 | 5/2000 |
| FR | 2800199 | 4/2001 |
| JP | 10079478 | 3/1998 |
| JP | 2000216362 | 8/2000 |

OTHER PUBLICATIONS

Tomonori, Sekiguchi, Japanese Patent Application 0824272, Publication No., 10079478, Machine Translation of Detailed Decription and Figures 9-12. Published Mar., 14, 1998.*

Preliminary Search Report dated Jan. 21, 2002 for French Patent Application No. 0105881.

* cited by examiner

*Primary Examiner*—Jennifer Kennedy
(74) *Attorney, Agent, or Firm*—Lisa K. Jorgenson; Jon A. Gibbons; Fleit, Kain, Gibbons, Gutman, Bongini & Blanco P.L.

(57) ABSTRACT

Process for fabricating a component, such as a capacitor in an integrated circuit, and integrated component, in which process and component a first electrode is in the form of a cup; a layer made of a dielectric covers at least the wall of the first electrode; a second electrode fills the cup; a first electrical connection via lies above the second electrode; and a second electrical connection via lies laterally with respect to and at a predetermined distance from the first electrode and is connected to the first electrode.

14 Claims, 3 Drawing Sheets

PROCESS FOR FABRICATING A COMPONENT, SUCH AS A CAPACITOR IN AN INTEGRATED CIRCUIT, AND INTEGRATED-CIRCUIT COMPONENT

CROSS REFERENCE TO RELATED APPLICATIONS

This application is based upon and claims priority from prior French Patent Application No. 0105881, filed May 2, 2001, the disclosure of which is hereby incorporated by reference in its entirety.

BACKGROUND OF THE INVENTION

1. Field of the Invention

The present invention generally relates to the field of integrated circuits and more particularly to integrated circuits with components such as capacitors having at least one electrode.

2. Description of Related Art

A component such as a capacitor formed in an integrated circuit usually comprises a first electrode with a U-shaped cross section formed in a main hole and a second electrode which has a part with a U-shaped cross section engaged in the first electrode, and a peripheral platform which passes over the top of the end edge of the first electrode and which lies beyond this edge, these two electrodes being separated by a dielectric. A layer of a dielectric covers and fills the second electrode. A first electrical connection via or local interconnection is formed through this covering layer and reaches the upper face of the platform of the second electrode. A second via is formed through the aforementioned covering layer and through the lower layers, passing at a predetermined distance from the peripheral edge of the platform of the second electrode, this second via being connected to the lower face of the first electrode by primary vias.

This previous structure although useful is very difficult to manufacture because of the requirement of multiple critical fabrication steps. This is especially true for the fabrication of the aforementioned main hole, the fabrication of the second electrode and the fabrication of the holes for the aforementioned first and second vias, which are dependent on the necessary minimum separation, on the one hand, between the outside of the edge of the first electrode and the peripheral edge of the platform of the second electrode and, on the other hand, between the peripheral edge of the second electrode and the second aforementioned via.

Moreover, the footprint of the component is partly determined by the separations specified above. According a need exists to overcome these shortcomings and difficulties with the prior art structures.

SUMMARY OF THE INVENTION

The present invention provides a structure of a component, such as an integrated-circuit capacitor, and a process for fabricating such a component, making it possible to reduce the number of critical fabrication steps and reduce the footprint of such a component.

Briefly, in accordance with the invention, a process for fabricating a component such as a capacitor in an integrated circuit, above a surface onto which first and second primary electrical connection vias open out, the vias being spaced apart and connected to each other below and at a predetermined distance from this surface.

According to the invention, this process consists in depositing a first layer made of an electrically non-conducting material on the surface; in forming a main hole in this first layer above the first connection via; in depositing a second layer made of an electrically conducting material, covering the walls of the main hole; in carrying out an operation of removing the second layer, leaving the conducting material only in the main hole so as to constitute a first electrode in the form of a cup in this main hole; in forming a dielectric at least on the inner surface of the cup; in depositing a third layer of a conducting material, filling the cup; in carrying out an operation of removing the third layer, leaving the conducting material only in the cup so as to constitute a second electrode separated from the first electrode by the aforementioned dielectric; in depositing a fourth layer made of an insulating material; in forming a first secondary hole passing through the fourth layer and reaching the top surface of the second electrode and a second secondary hole passing through the fourth layer and the first layer, at a predetermined distance from the main hole, and reaching the top surface of the second via; and in filling the first and second secondary holes with an electrically conducting material so as to constitute connection vias for the electrodes.

According to the invention, the aforementioned dielectric may consist of an intermediate layer made of an electrically non-conducting material, interposed between the electrodes.

The process according to the invention preferably consists in depositing an intermediate layer before the third layer is deposited, so as to constitute the aforementioned dielectric.

The process according to the invention preferably consists in carrying out an operation of removing the third layer and the intermediate layer, leaving the conducting material and the non-conducting material of these layers only in the cup so as to constitute, in the cup, a second electrode separated from the first electrode by the aforementioned dielectric.

According to the invention, the removal operations are preferably planarizing operations, in particular chemical-mechanical polishing operations.

The process according to the invention preferably consists in depositing a fifth layer made of an electrically conducting material, filling the first and second holes so as to constitute the electrical connection vias, and in etching this fifth layer so as to constitute independent electrical connection lines for these vias on the fourth layer.

The subject of the present invention is also an integrated-circuit component such as a capacitor.

According to the invention, this component comprises a first electrode in the form of a cup; a layer made of a dielectric covering at least the wall of the first electrode; a second electrode filling the cup; a first electrical connection via extending above the second electrode; and a second electrical connection via lying laterally with respect to and at a predetermined distance from the first electrode and connected to the latter.

According to the invention, the component preferably comprises a first primary electrical connection via connected to the first electrode and lying below the latter, a second primary electrical connection via connected to the second electrical connection via, and an electrical connection branch connecting the first and second primary vias and lying below and at a predetermined distance from the first electrode.

According to the invention, the electrical connection branch preferably includes a control device.

According to the invention, the component preferably includes electrical connection lines connected to the first and second secondary vias.

BRIEF DESCRIPTION OF THE DRAWINGS

The subject matter which is regarded as the invention is particularly pointed out and distinctly claimed in the claims at the conclusion of the specification. The foregoing and other features, and advantages of the invention will be apparent from the following detailed description and by studying a component such as a capacitor of an integrated circuit and its fabrication process, these being described by way of non-limiting examples and illustrated by the accompanying drawings.

DETAILED DESCRIPTION OF AN EMBODIMENT

Figure 1:
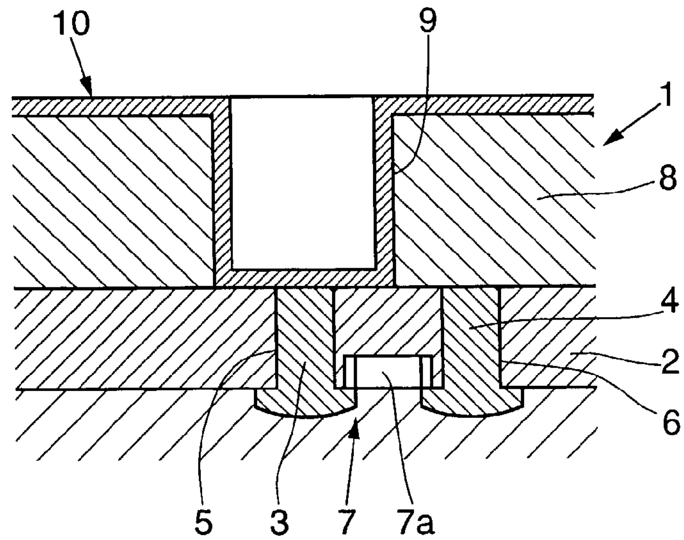
FIG. 1 shows a component of an integrated circuit after a first fabrication step.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In the drawing like numerals refer to like parts through several views.

FIG. 1 shows part of an integrated circuit 1 during fabrication, this circuit comprising, in a lower layer 2 made of an electrically non-conducting material such as silica, first and second primary electrical connection vias or local interconnections 3 and 4 filling holes 5 and 6 which are separated from each other. In a manner known per se, these primary vias 3 and 4 are connected, near the lower face of this lower layer 2, through a branch 7 comprising a control device 7*a*, such as a transistor.

Deposited on the surface of the lower layer 2 is a first layer 8 made of an electrically non-conducting material or a dielectric, such as silica, in which is formed, by photolithography and etching, a main through-hole 9 onto the bottom of which the top face of the first primary via 3 opens, the top face of the second primary via 4 lying laterally with respect to and at a predetermined distance from this main hole 9.

After this, a second layer 10 made of an electrically conducting material, such as polysilicon, is deposited on the first layer 8, this second layer 10 covering the walls and the bottom of the main hole 9.

Figure 2:
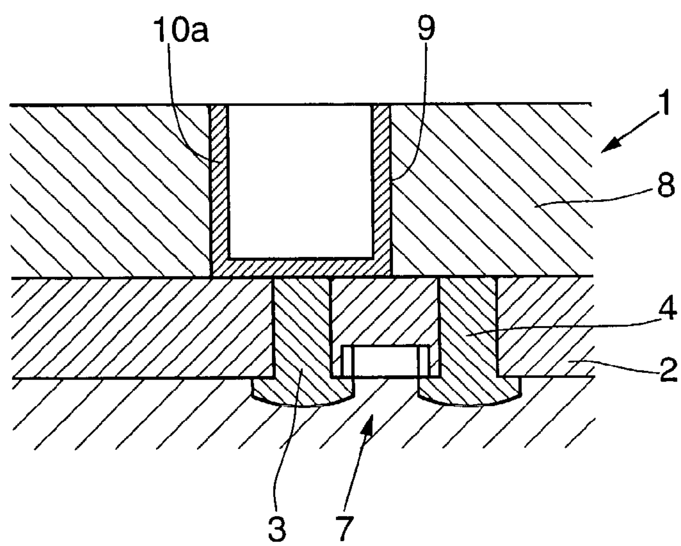
FIG. 2 shows the component after a second fabrication step.

As shown in FIG. 2, the process then continues with an operation of removing the second layer 10, leaving the material of this layer only in the main hole 9 so as to constitute a first electrode 10*a* in the form of a cup in this main hole 9. This removal operation is advantageously carried out by means of a planarizing machine, such as a chemical-mechanical polishing machine.

Figure 3:
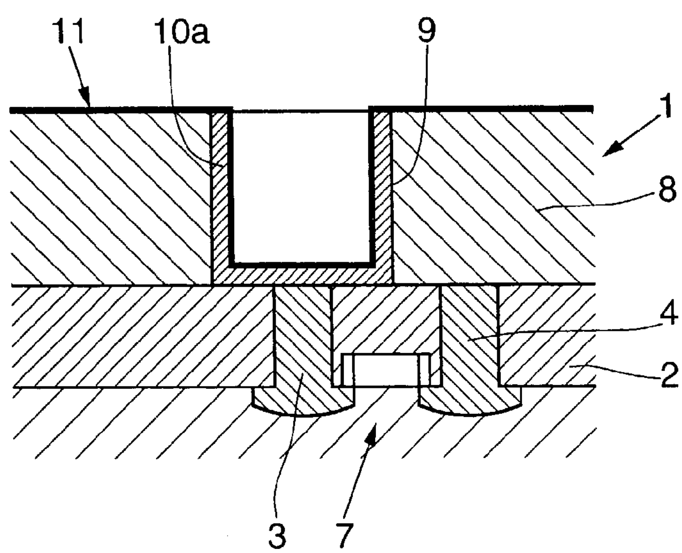
FIG. 3 shows the component after a third fabrication step.

As shown in FIG. 3, the process then continues with the deposition of a thin interlayer 11 made of a dielectric, for example an oxynitride, this interlayer 11 covering the exposed surfaces of the first electrode 10*a*.

Figure 4:
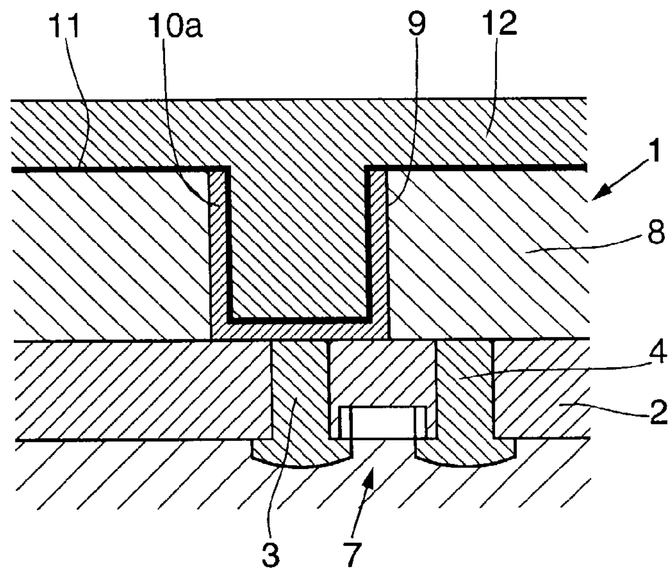
FIG. 4 shows the component after a fourth fabrication step.

As shown in FIG. 4, the process then continues with the deposition of a third layer 12 made of an electrically conducting material, such as polysilicon, in such a way that this third layer 12 fills the cup formed by the first electrode 10*a* covered with the interlayer 11.

Figure 5:
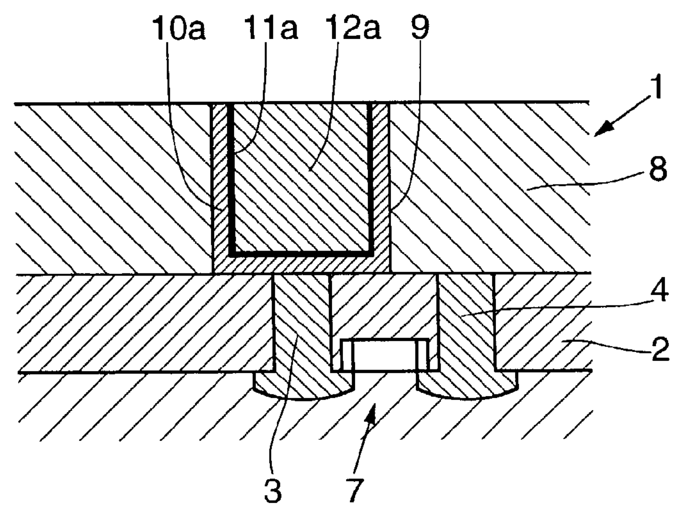
FIG. 5 shows the component after a fifth fabrication step.

As shown in FIG. 5, the process then continues with an operation of removing the third layer 12 and the interlayer 11, leaving the conducting material only in the cup so as to constitute a second electrode 12*a* filling the first electrode 10*a* and separated from the latter by that part of the interlayer 11 which remains between the first electrode 10*a* and the second electrode 12*a* and constituting a dielectric 11*a*. This removal operation is advantageously carried out by means of a planarizing machine, such as a chemical-mechanical polishing machine.

Thus, the surface of the front edge of the first electrode 10*a*, the surface of the front edge of the dielectric 11*a* and the top surface of the second electrode 12*a* follow one another substantially in the plane of the top surface of the first layer 8.

Figure 6:
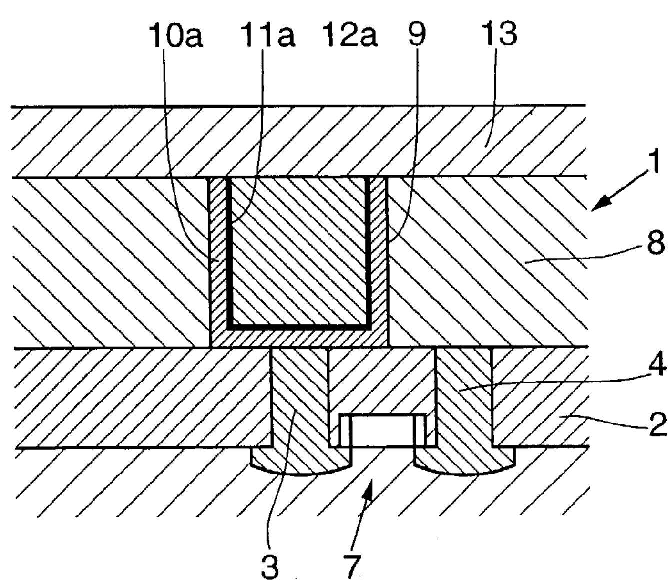
FIG. 6 shows the component after a sixth fabrication step.

Next, as shown in FIG. 6, a fourth layer 13 of an electrically non-conducting material, such as silica, is deposited.

Figure 7:
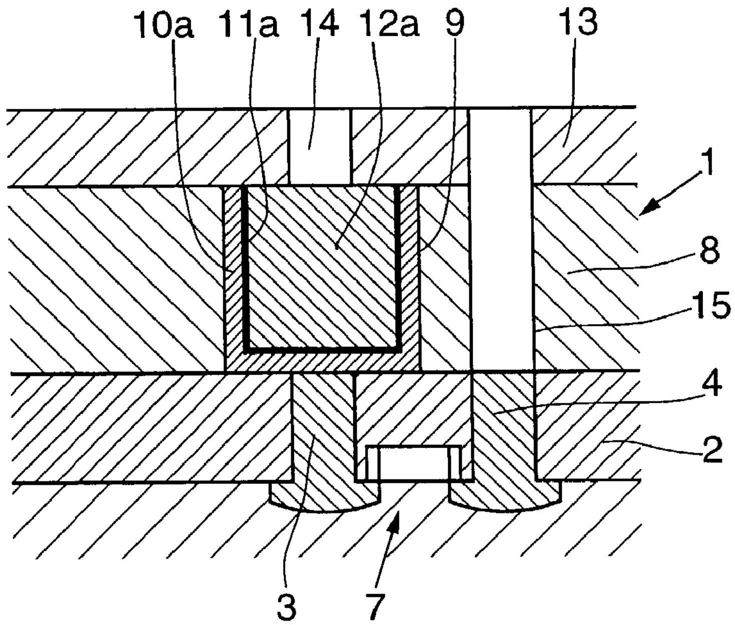
FIG. 7 shows the component after a seventh fabrication step.

As shown in FIG. 7, the process then continues, by photolithography followed by etching, with the formation of a first secondary hole 14 through the fourth layer 13 and reaching the top surface of the second electrode 12*a* and the formation of a second secondary hole 15 through the fourth layer 13 and the first layer 8 and reaching the top surface of the second primary via 4, the secondary hole 15 running laterally with respect to and at a predetermined distance from the main hole 9.

Figure 8:
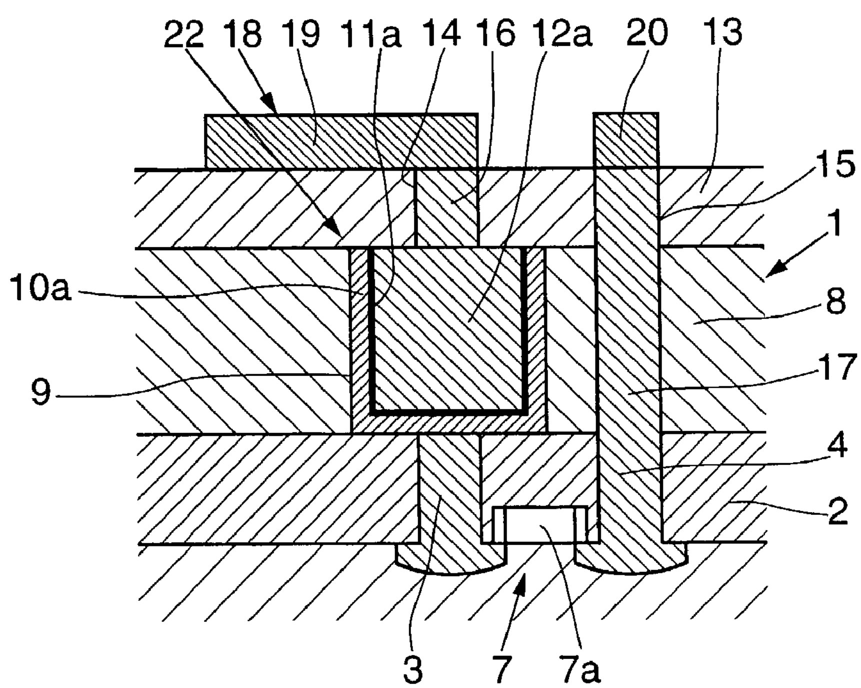
FIG. 8 shows the component after an eighth fabrication step, this figure representing the final component.

As shown in FIG. 8, the process then continues with the filling of the holes 14 and 15 with an electrically conducting material, in particular tungsten or copper, so as to constitute electrical connection vias 16 and 17 for the second electrode 12*a* and for the second primary via 4, which is connected to the first electrode 10*a*, right to the surface of the fourth layer 13.

As also shown in FIG. 8, the process includes the deposition of a fifth layer 18 made of an electrically conducting material, for example copper or tungsten, followed by photolithography and etching operations on this layer so as to constitute, on the fourth layer 13, independent lines 19 and 20 for electrically connecting the electrodes 10*a* and 12*a* by means of the aforementioned vias.

In an alternative method of implementation, it would be possible to deposit the fifth layer 18 directly, in such a way that the latter fills the holes 14 and 15 so as to constitute the vias 16 and 17 directly, and then to form the electrical connection lines 19 and 20.

As shown in FIG. 8 in its final form, a capacitor 22 is then obtained, composed of the electrodes 10*a* and 12*a* separated by the dielectric 11*a*, the electrode 10*a* of which is connected to the electrical connection line 20 by means of the first primary via 3, the transistor 7, the second primary via 4 and the secondary via 17, and the second electrode 12*a* of which is connected to the electrical connection line 19 by means of the secondary via 17.

It follows from the foregoing that the first electrode 10*a* and the second electrode 12*a*, which are separated by the dielectric 11*a*, constitute a compact assembly. The principal limiting condition, which depends on the electrical characteristics to be obtained, consists of the separation between the main hole 9, in which the first electrode 10*a* is formed, and the second hole 15, in which the via 17 is formed. Another limiting condition is determined by the separation between the inner edge of the first electrode 10*a* and the secondary hole 14 in which the via 16 is formed, the cross section of this via 16 normally being substantially less than the cross section of the second electrode 12*a* to which it is connected.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A method for fabricating a component in an integrated circuit, the method comprising:

depositing a first layer made of an electrically non-conducting material on a lower layer insulator with a surface wherein a first primary electrical connection via and a second primary electrical connection via open out to the surface, each of the first primary electrical connection via and the second primary electrical connection via being spaced apart at a predetermined distance and electrically connected to each other below the surface;

forming a main hole in the first layer above the first primary connection via, wherein the main hole consists of one contiguous side wall and a bottom;

depositing a second layer made of an electrically conducting material, covering the sides and the bottom of the main hole;

removing the second layer over a top surface of the first layer and leaving the electrically conducting material only in the main hole so as to constitute a first electrode in a form of a cup in the main hole;

forming a dielectric layer over all an inner surface of the cup;

depositing a third layer of an electrically conducting material, filling the cup;

removing the third layer and the dielectric layer over the top surface of the first layer and, leaving the electrically conducting material and dielectric only in the cup so as to constitute a second electrode separated from the first electrode by the dielectric, the first electrode, the dielectric layer and the second electrode being formed exclusively in the main hole;

depositing a fourth layer made of an electrically non-conducting material defining a top surface;

forming using a photolithography and an etching step, a first secondary hole passing through the fourth layer and reaching a top surface of the second electrode, the first secondary hole being formed directly above the main hole in order to eliminate the use of off-set vias, and a second secondary hole passing through the fourth layer and the first layer, at a predetermined distance from the main hole, and reaching a top surface of a second primary connection via; and filling the first secondary hole and the second secondary hole with an electrically conducting material so as to form a connection via for the first electrode and a connection via for the second electrode;

wherein the second electrode is electrically connected to the connection via in the first secondary hole which opens out in the top surface of the fourth layer;

wherein the first electrode is electrically connected to the first primary connection via and a branch disposed in the lower layer insulator and the connection via in the second secondary hole which opens out in the top surface of the fourth layer.

2. The method according to claim 1, wherein the step of forming a dielectric includes forming a dielectric consisting of an intermediate layer made of an electrically non-conducting material, interposed between the first electrode and the second electrode.

3. The method according to claim 1, wherein the step of forming a dielectric includes depositing an intermediate layer before the third layer is deposited, so as to form the dielectric.

4. The method according to claim 2, wherein the step of forming a dielectric includes depositing an intermediate layer before the third layer is deposited, so as to form the dielectric.

5. The method according to claim 3, further comprising:

removing the third layer and the intermediate layer in at least part of an area surrounding the cup so to form, in the cup, a second electrode separated from the first electrode by the dielectric.

6. The method according to claim 4, further comprising:

removing the third layer and the intermediate layer in at least part of an area surrounding the cup so to form, in the cup, a second electrode separated from the first electrode by the dielectric.

7. The method according to claim 1, wherein the step of removing the second layer and removing the third layer includes removing the second layer and the third layer using a planarization operation.

8. The method according to claim 4, wherein the step of removing the second layer and removing the third layer includes removing the second layer and the third layer using a planarization operation.

9. The method according to claim 5, wherein the step of removing the second layer and removing the third layer includes removing the second layer and the third layer using a planarization operation.

10. The method according to claim 6, wherein the step of removing the second layer and removing the third layer includes removing the second layer and the third layer using a planarization operation.

11. The method according to claim 1, further comprising:

depositing a fifth layer made of an electrically conducting material;

filling the first secondary hole and the second secondary hole so as to constitute the connection vias; and etching the fifth layer so as to constitute independent electrical connection lines for the vias on the fourth layer.

12. The method according to claim 4, further comprising:

depositing a fifth layer made of an electrically conducting material;

the first secondary hole and the second secondary hole so as to constitute the connection vias; and etching the fifth layer so as to constitute independent electrical connection lines for the vias on the fourth layer.

13. The method according to claim 5, further comprising:

depositing a fifth layer made of an electrically conducting material;

the first secondary hole and the second secondary hole so as to constitute the connection vias; and etching the fifth layer so as to constitute independent electrical connection lines for the vias on the fourth layer.

14. The method according to claim 6, further comprising:

depositing a fifth layer made of an electrically conducting material;

the first secondary hole and the second secondary hole so as to constitute the connection vias; and etching the fifth layer so as to constitute independent electrical connection lines for the vias on the fourth layer.

* * * * *